United States Patent [19]

Savicki

[11] Patent Number: 5,264,752
[45] Date of Patent: Nov. 23, 1993

[54] AMPLIFIER FOR DRIVING LARGE CAPACITIVE LOADS

[75] Inventor: Joseph P. Savicki, Clinton, N.J.

[73] Assignee: AT&T Bell Laboratories, Murray Hill, N.J.

[21] Appl. No.: 891,244

[22] Filed: Jun. 1, 1992

[51] Int. Cl.$^5$ .......................................... H01L 41/08
[52] U.S. Cl. ...................................... 310/316; 310/317
[58] Field of Search .................. 310/316, 317; 318/116

[56] References Cited

U.S. PATENT DOCUMENTS

| | | | |
|---|---|---|---|
| 4,404,502 | 9/1983 | Magori et al. | 318/116 |
| 4,767,959 | 8/1988 | Sakakibara et al. | 310/317 |
| 4,947,074 | 8/1990 | Suzuki | 310/316 |

Primary Examiner—Mark O. Budd
Attorney, Agent, or Firm—Charles E. Graves

[57] ABSTRACT

An amplifier design for a capacitive load reduces power supply requirements by recovering, during the discharge of the capacitive load, a substantial amount of the stored energy without causing noise signals to be created. The recovered energy is stored in novel series-connected capacitors to be reused during the subsequent load charge cycle. The stack becomes an effective multiple power supply source. The capacitors are successively switched and thus sequentially harnessed to the load capacitor so that the voltage across the load capacitor is increased by selected step increments instead of by one large voltage jump which causes circuit noise. By using MOSFET devices for the switches, the voltage increase during charging and decrease during discharging is continuous, thus eliminating the step function which causes much of the deleterious noise. The amplifier is especially useful as a driver for an actuator in an active control system for quieting noise-causing vibrations in buildings and other structures, which can be a health hazard.

19 Claims, 6 Drawing Sheets

AMPLIFIER FOR DRIVING LARGE CAPACITIVE LOADS

GOVERNMENT CONTRACT

This invention was made with Government support under N00014-90-C-0258 awarded by the Department of the Navy. The government has certain rights in this invention.

FIELD OF THE INVENTION

This invention relates generally to energy cancellation apparatus; and more specifically, to amplifiers for driving large capacitive loads which counter or dampen periodic mechanical energy present in vibrating machinery and other structures.

BACKGROUND OF THE INVENTION

Certain machine-generated noise in both residential and industrial environments, particularly continuous levels of low frequency noise, are disturbing to workers. The more pronounced types of incidental noise is linked to headaches, hearing impairments and other health-related conditions. This type of noise often may be conducted throughout a building structure to reach workers in locations well beyond the source. Noise generated and/or conducted through heating/cooling systems likewise can reach workers throughout a facility. In one approach to reducing the effect of machinery noise and vibrations, electromechanical devices are used as an actuator to actively generate predetermined forces or sounds near the noise source which cancel the noise energy. One such type of electromechanical device uses an electrostrictive material which in response to applied electric fields changes dimension or generates forces. Another material sometimes used in this application is piezoelectric.

Although electrostrictive materials have many advantages as actuators in active noise cancellation systems, their full utility has not been realized. One problem is that the electrostrictive structure, consisting of the material plus the driver electrodes, presents a substantial capacitive load to the control electronics. The result can be a low device operating efficiency.

Prior art actuator amplifier designs include rudimentary switching amplifiers and narrow band resonant circuits to recycle the energy and improve the electrical efficiency of the system. However, known switching amplifier designs generate substantial amounts of undesirable electrical noise. If this noise is allowed to operate on the electrostrictive structure, even more noise may be generated and propagated. Amplifier output signal filtering may be employed to reduce this effect, but the filtering in turn introduces signal phase shifts which must be compensated for by the control electronics. The net effect is a reduced control signal frequency span or bandwidth.

In addition, electrical noise generated by prior art switching designs tends to radiate and interfere with other sensitive electrical systems. Alleviating this further problem requires significant electrical shielding and power supply filtering at added costs.

In situations where the voltage/potential across the electrostrictive structure remains small, low electrical efficiency is tolerable. However, if large counter-forces are desired or if the volume of electrostrictive material is minimized to realize lower costs, large time varying voltages/potentials are required. In these cases, low electrical efficiency results in substantial power delivery and cooling difficulties, and increased energy costs. Particularly when a larger bandwidth or low electrical phase shift is required at large operating voltages the prior art offers no solutions.

Prior art designs of actuator amplifiers are also difficult to adapt to different voltage requirements. For instance, if a given switching amplifier design is to be used in both a high voltage application and a lower voltage application, either two designs are required with differing device voltage and current ratings; or one design incorporating the worst case use is required.

SUMMARY OF THE INVENTION

In accordance with the invention, an amplifier design for a capacitive load has been conceived which reduces power supply requirements by recovering, during the discharge of the capacitive load, a substantial amount of the stored energy. This recovered energy is stored in power supply filter capacitors to be reused during the subsequent load charge cycle, thus reducing the net energy required from the power supply per complete cycle.

In one embodiment, the invention improves over the power dissipation factors of prior art designs of large bandwidth driving amplifiers by using multiple power supplies advantageously consisting of plural stacked capacitors, each of a different, selected voltage level. These are sequentially harnessed to a load capacitor so that the voltage across the load capacitor is increased by selected step increments. Any one of the supplies delivers a desired, predetermined charge to the load capacitor. This load charging procedure, in the limit of a large number of power supplies, can reduce the energy supplied by the power supplies by one-half.

In accordance with the invention, the efficiency of operation is substantially improved through a reversal of the capacitor charge sequence. The invention further may be realized in a number of identical modules, the number of which determines the maximum usable voltage. Thus, the addition or removal of modular stages is required to satisfy differing application requirements.

These and other features of the invention will be fully appreciated from a reading of the description to follow of an illustrative embodiment.

DESCRIPTION OF THE DRAWING

FIG. 6 is a further variation of the circuit of FIG. 3;

DETAILED DESCRIPTION OF AN ILLUSTRATIVE EMBODIMENT

The invention will be appreciated by a consideration of FIGS. 1-4 which generally describe the switched charging and discharging of capacitors.

Figure 1:
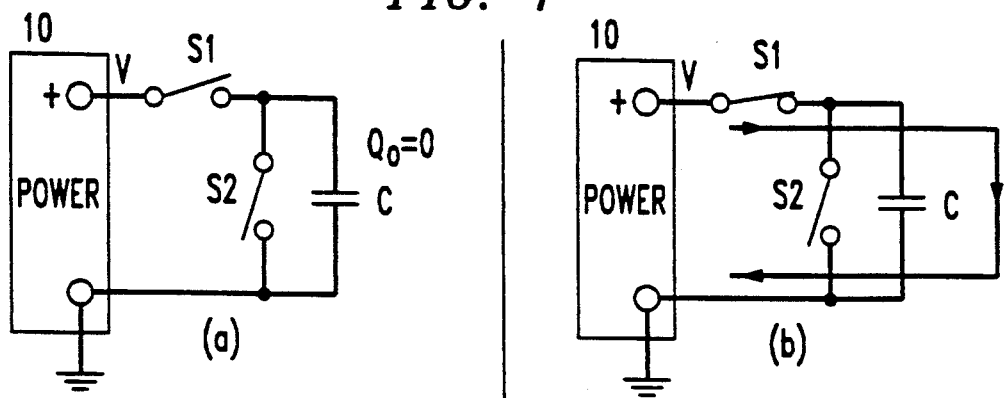
FIG. 1 is a schematic circuit diagram showing a general switched charging of a capacitive load.

In FIG. 1, a single power supply charging and discharging a load capacitor is shown in four states of its cycle. Power supply 10 is switched by switches S1 and S2 to charge capacitor C. In state (a), with both switches open, no charge exists on capacitor C. In state (b) switch S1 is closed with S2 remaining open, resulting in state (c) wherein a charge Q0 is acquired by capacitor C. Capacitor C is discharged in state (c) with the closing of switch S2. Thus, a charge Q=CV flows from the power supply and is lost forever during the discharge of the load capacitor. In the process, power supply 10 delivers an energy equal to capacitance C times voltage V squared per cycle.

Figure 2:
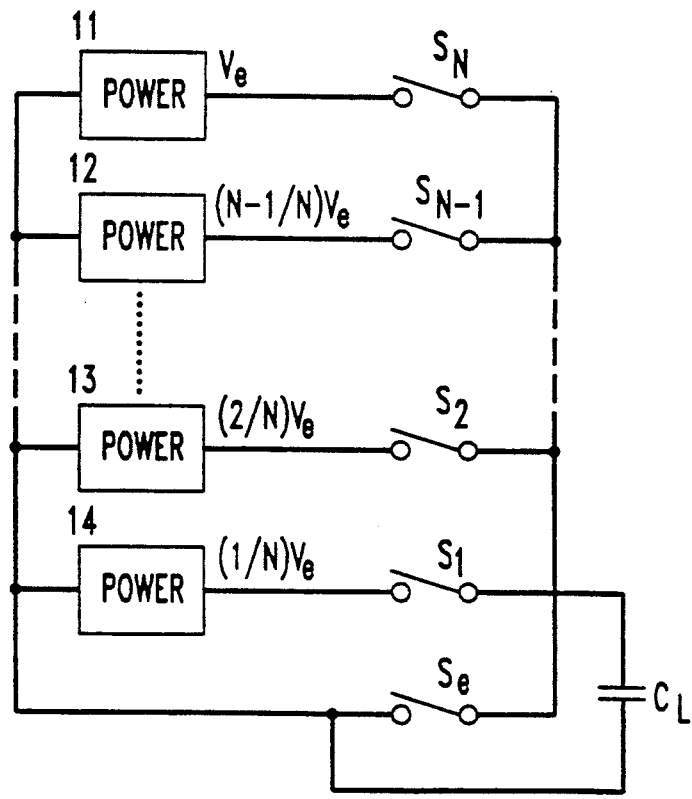
FIG. 2 is a schematic circuit diagram showing a switched charging of a capacitive load with multiple sequentially switched power supplies.

FIG. 2 shows how multiple, sequentially switched power sources 11, 12, 13, 14 switched by switches S1, S2, S(N−1), SN reduce total power requirement to operate load capacitor CL. Starting with all switches open, switch S0 is closed to ensure total discharge of capacitor CL. Next, switch S0 is opened and switch S1 is closed to raise the load voltage to a value Vo/N where N=the actual number of switched sources. Then, switch S1 is opened and switch S2 is closed. The sequence continues until switch SN is closed. If switches S0 through Sn are closed one at a time and in sequence, energy according to equation (1) is delivered by the power supplies.

$$E_0 = C_0 V_0^2 \left[ \frac{N+1}{2N} \right] \quad (1)$$

If, however, the discharge of load capacitor CL is accomplished by a reversal of the charge sequence, energy is returned to the power supplies. The net energy per cycle required of the power supplies 11-14, in this case is given by equation (2):

$$E_0 = \frac{C_0 V_0^2}{N} \quad (2)$$

Figure 3:
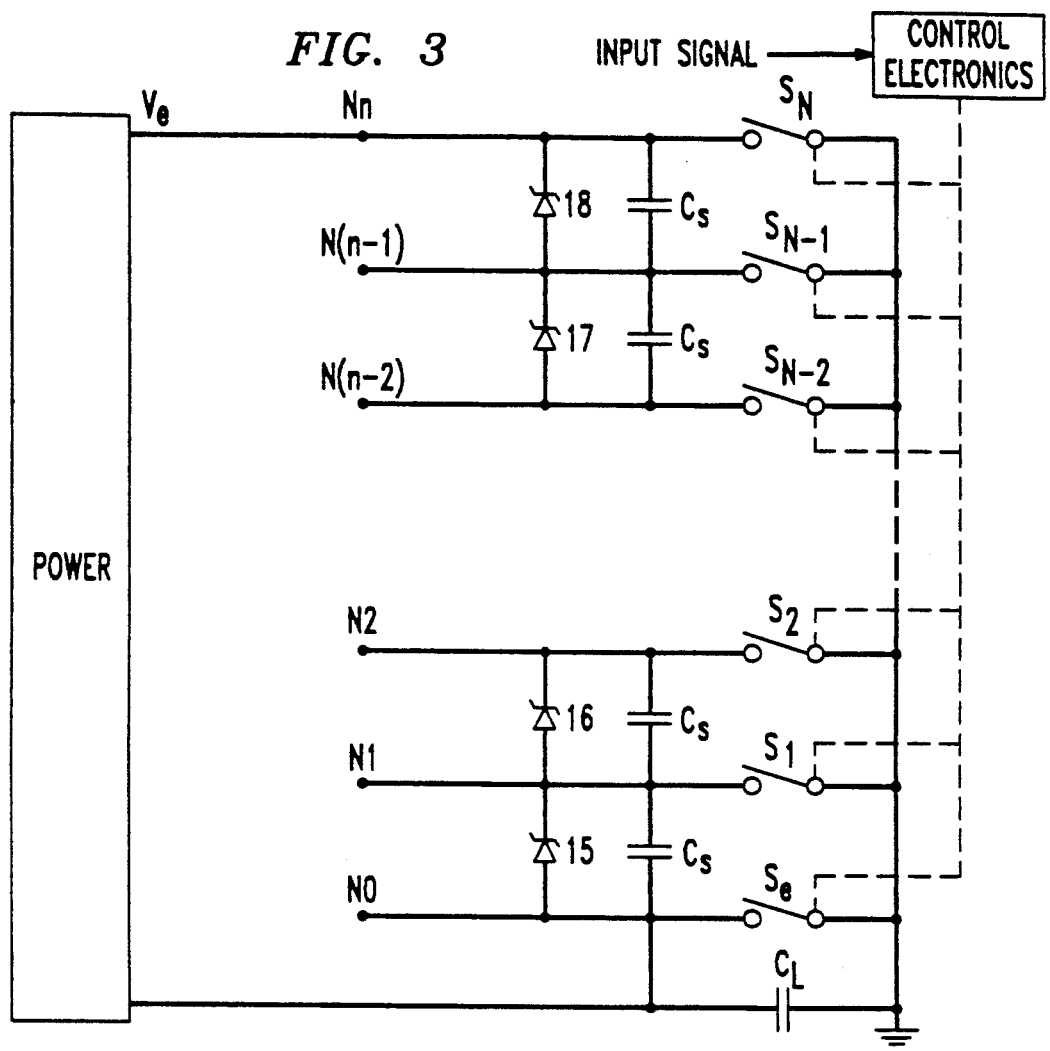
FIG. 3 is a schematic circuit diagram showing a general switched charging of a capacitive load powered by a capacitor stack in accordance with the invention.

FIG. 3 illustrates how, pursuant to the invention, the circuit of FIG. 2 can be adapted for single power supply operation. A stack of series-connected capacitors CS connected in parallel relation with diodes 15-18, mimic the behavior of the multiple power supplies 11-14 of FIG. 2.

Figure 4:
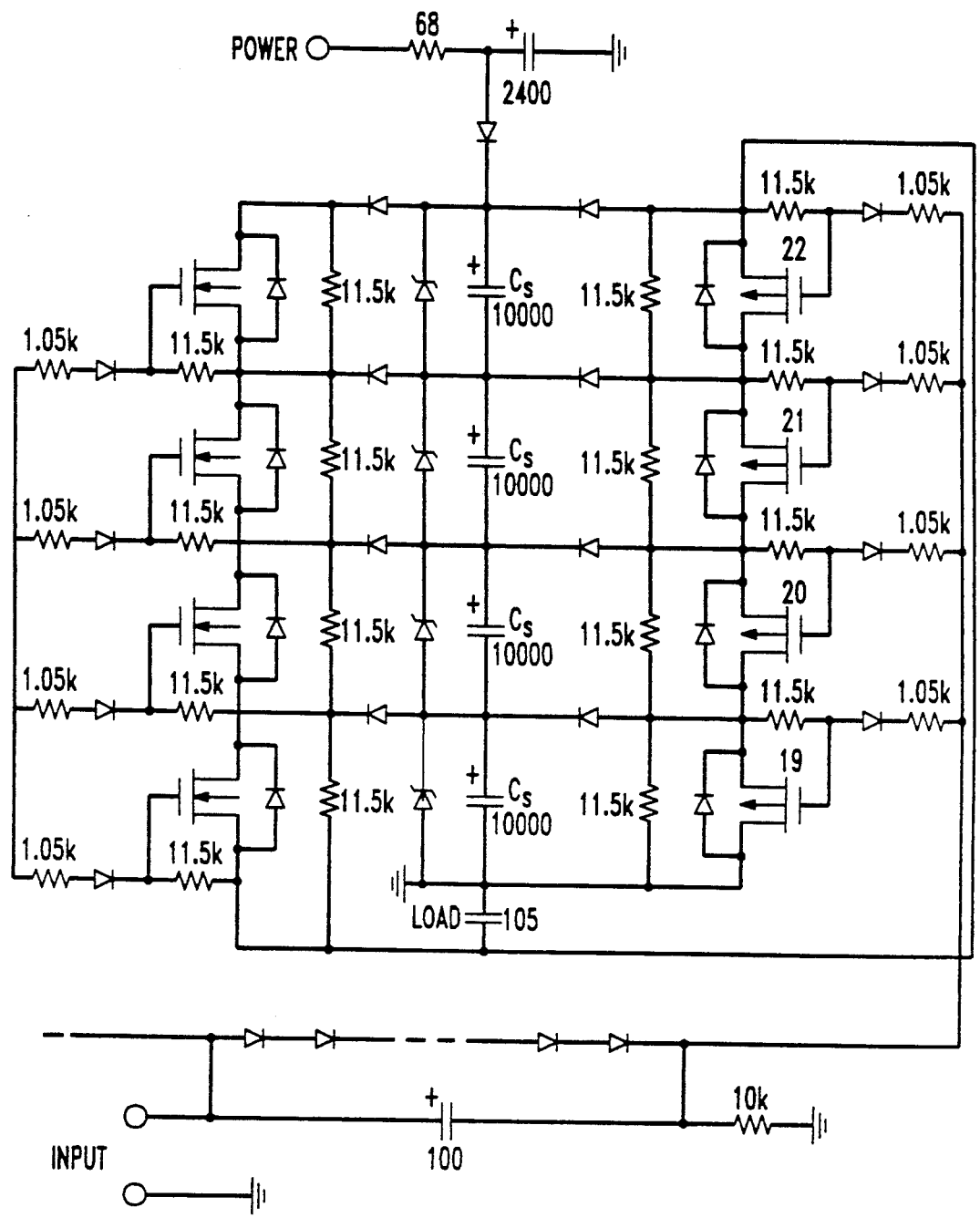
FIG. 4 is a schematic circuit diagram of a 4-stage switched charge and discharge of a capacitive load powered by a generalized capacitor stack.
Figure 4:
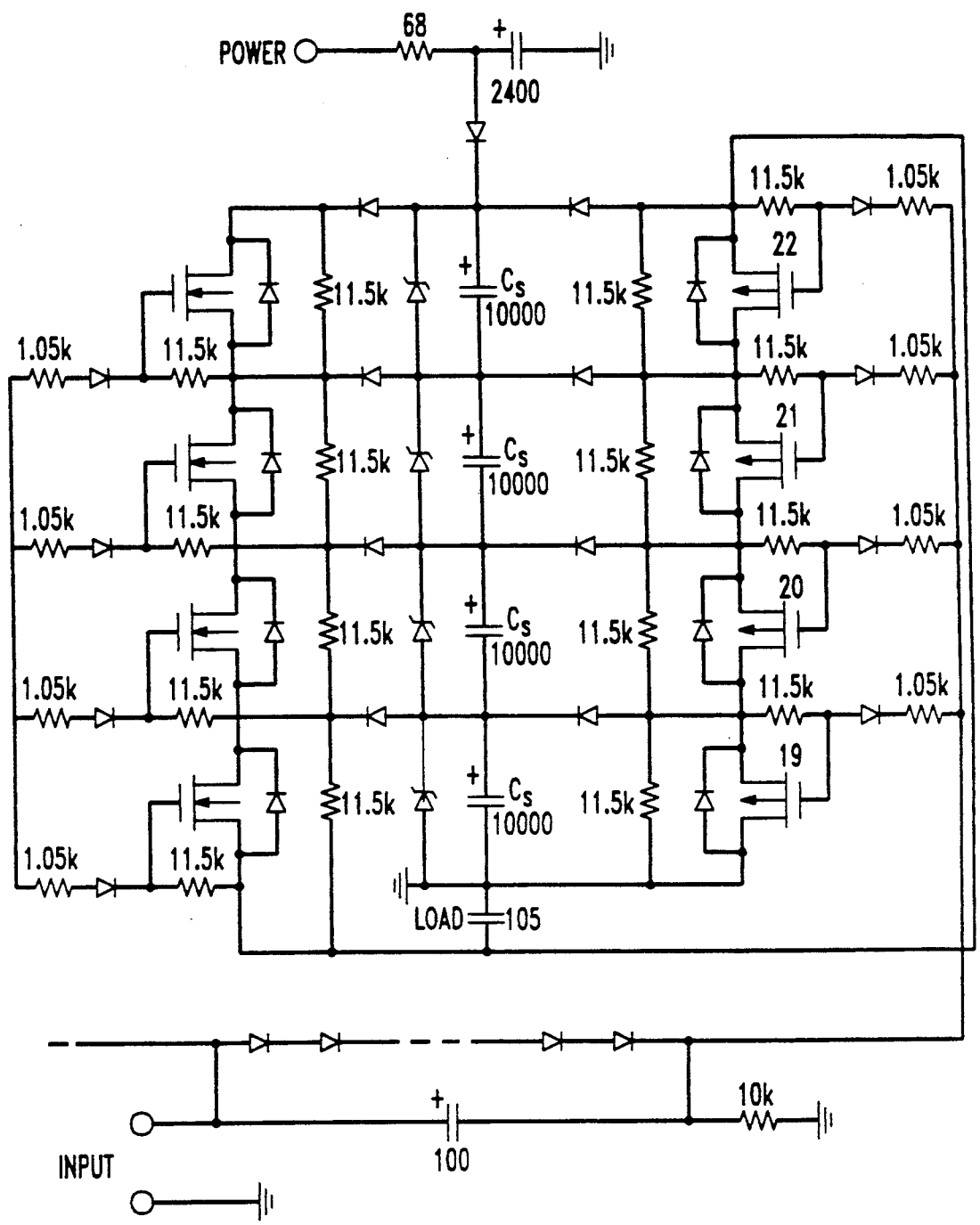

FIG. 4 illustrates an exemplary circuit for a four-stage implementation of the instant invention. It includes the use of a capacitor stack of the type shown in FIG. 3 consisting of capacitors CS. Advantageously, MOS devices 19-22 and associated circuitry may replace the switches of FIG. 3. Low noise and high linearity over a wide frequency bandwidth is achieved by the circuit of FIG. 4.

Figure 5:
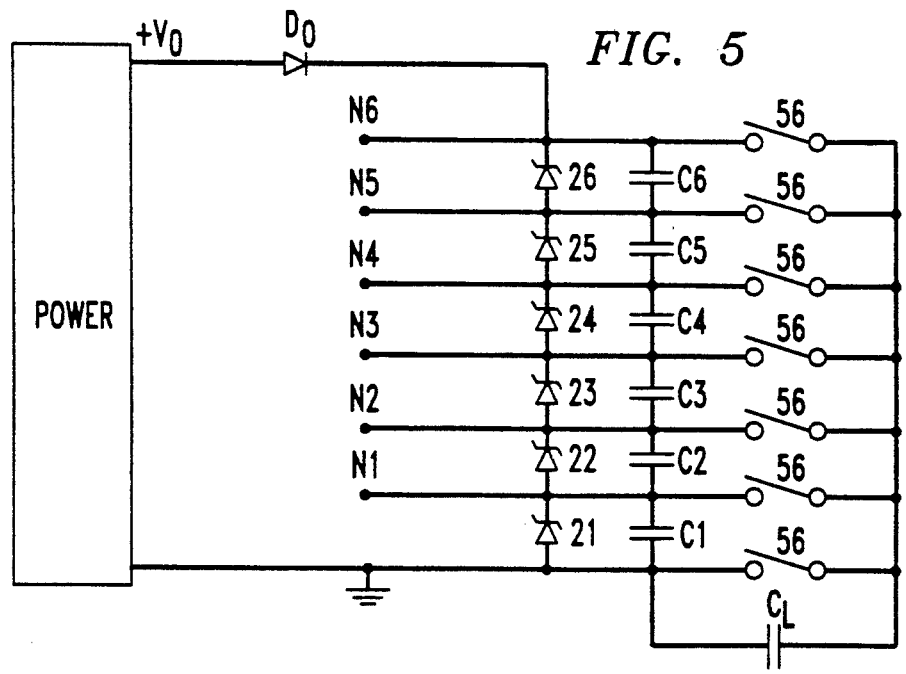
FIG. 5 is a variation of the circuit of FIG. 3.

In a more specific illustrative embodiment of the invention, a design which operates from a single external power supply is illustrated in FIG. 5. A power supply P0 maintains a voltage of +V0 relative to GROUND at the anode of diode D0. The function of diode D0 is to prevent charge from flowing back into the +V0 output of external power supply P0. Diode D0 may not be required for particular external supply designs (P0). With switches S0, S1, S2, S3, S4, and S5 open and switch S6 closed, the power supply P0 is turned on and supplies current through diode D0 to charge stack capacitors C1, C2, C3, C4, C5, and C6. Load capacitor CL is also charged to +V0 minus the drop across diode D0.

In this embodiment, the values of stack capacitors C1 through C6 are all substantially identical. These values are chosen to be large relative to load capacitor CL. Zener diodes Z1, Z2, Z3, Z4, Z5 and Z6 protect the stack capacitors C1 through C6 from overvoltage conditions. The zener voltages are chosen as large as possible under this protection constraint.

With component values chosen as above, the voltage dropped across each stack capacitor C1 through C6 is identical within device tolerances. Thus, the voltage at node N6 is +V0 minus the drop across diode D0. The voltage at node N1 is 1/6 that of node N6, node N2 is 2/6 that of node N6, node N3 is 3/6 that of node N6, node N4 is 4/6 that of node N6, and node N5 is 5/6 that of node N6. These nodes N1 through N6 now represent virtual multiple power supplies for the switches S1 through S6.

Operation starts with switch S6 closed to ensure the same voltage across the load capacitor CL and node N6 (all voltages are measured relative to ground). Switch S6 is opened, followed by closure of switch S5. Charge flows from the load capacitor CL through switch S5 and down the capacitor stack formed by capacitors C5, C4, C3, C2, and C1. This results in an increased voltage drop across capacitors C1 through C5. If this drop is excessive, some of zener diodes Z1 through Z5 will conduct and protect the capacitors C1 through C5. The effect of the charge delivered to the capacitor stack is to raise the voltage of node N6 and reverse bias diode D0. This essentially isolates the external power supply during this part of the discharge cycle of load capacitor CL.

Charge continues to flow from the load capacitor CL into the capacitor stack until the load capacitor voltage and the node N5 voltage are equal. At this point, switch S5 is opened and switch S4 is closed. Once again, charge flows from the load capacitor CL, this time through switch S4 and stack capacitors C1 through C4. The voltage drop across C1 through C4 is again increased, and the voltages at nodes N5 and N6 also increase. This further increases the reverse bias on diode D0. When the voltage across the load capacitor CL and the voltage at node N4 are equal, switch S4 is opened. Switch S3 is next closed and so on until switch S0 is closed. When S0 is closed the load capacitor is completely discharged through S0 and the discharge cycle for load capacitor CL is complete.

Because the voltages of all nodes N1 through N6 have increased since the start of this discharge cycle, energy has been recovered from the load capacitor CL and stored on stack capacitors C1 through C5 in accordance with the invention. Stack capacitor C6, however, contains no recovered charge or energy.

The recharging of the load capacitor now proceeds in reverse sequence of the discharge cycle. Switch S0 is opened and switch S1 is closed. Charge flows from capacitor C1 through switch S1 into load capacitor CL. This continues until the voltage across load capacitor CL equals the voltage of node N1. In this example, no charge flows from the power supply at this time, as diode D0 is still under a reverse bias condition. Switch S1 is opened and switch S2 is closed. Now charge flows from stack capacitors C1 and C2 through switch S2 into the load capacitor CL. Again charge flows until the voltage drop across the load capacitor CL equals the voltage of node N2. Again, no charge flows from the power supply.

This process continues until switch S5 is opened and switch S6 is closed. At this time charge flows from the power supply, through diode D0 and into the load capacitor CL. Charge continues to flow until the voltage drop across the load capacitor CL equals the power supply voltage V0 minus the voltage drop across diode D0. This completes one cycle of operation. The charge flowing from the power supply during this cycle (start of discharge to completion of charge cycle) is approximately 1/6 that which would be required if no capacitor stack and only one power supply were used. Since no node voltage changes by more than 1/6 of V0 during any step in the cycle, low electrical noise is achieved.

One potentially undesirable aspect of the circuit of FIG. 5 is that some of the switches S0 through S6 must, when in an open condition, support large voltage drops (on the order of V0). The mechanical switches of the preceding embodiments may be replaced with semiconductor switching. However, if high voltage semiconductor switching devices are needed in a given application, their high cost may be a deterrent. An alternative design, described below in connection with FIG. 6, uses high voltage semiconductor steering diodes and lower voltage switching devices.

The embodiment of FIG. 6 contains stack capacitors C1 through C6 that function similarly to those described above. As above, zener diodes Z1 through Z6 protect the stack capacitors C1 through C6 from overvoltage conditions. Diode D0 prevents charge from flowing back into the power supply terminal at +V0 obtained from power supply P0. The switches S0 through S6 of the FIG. 5 embodiment are replaced with current-steering diodes D1 through D12 and switches S1 through S12 as shown in FIG. 6.

Circuit operation starts with stack capacitors C1 through C6 in charged condition. With switches S7 through S12 closed and switches S1 through S6 open, the voltage drop across load capacitor CL is the same as the voltage at node N6 minus the voltage dropped across diode D12. The discharge cycle of the load capacitor CL begins by opening all switches S1 through S12 followed by closure of switch S6. At this time, charge flows from load capacitor C1 through switch S6, diode D6 and through stack capacitors C5, C4, C3, C2 and C1. This results in an increase in node N1 through N6 voltages, thus reverse-biasing diode D0. Power supply P0 is isolated from the circuit at this point due to the reverse bias of diode D0. When the voltage across load capacitor CL equals the voltage of node N5 minus the voltage drop across diode D6, switch S5 is closed. Switch S6 remains closed for the duration of the discharge cycle. Charge flows from load capacitor CL through switches S6 and S5, through diode D5 and into capacitors C4, C3, C2 and C1.

Charge does not flow through diode D6 during this portion of the cycle, as diode D6 is reverse-biased. Again, charge flows until the voltage drop across load capacitor CL equals the voltage of node N4 minus the voltage drop across diode D5. Operation continues in this manner until switch S1 is closed. At this time, charge flows from load capacitor CL, through closed switches S6, S5, S4, S3, S2, and S1, and through diode D1. No charge flows through diodes D2, D3, D4, D5 and D6, as these diodes are reverse-biased. This completes the discharge cycle of load capacitor CL, the voltage drop across CL being equal to the voltage drop across diode D1.

The load charge cycle begins by opening all switches S1 through S12 followed by closure of switch S7. Charge flows from stack capacitor C1, through diode D7, switch S7 and into the load capacitor CL. Charge continues to flow until the voltage of node N1 equals the voltage drop across load capacitor CL plus the voltage drop across diode D7. This results in reduced voltages on nodes N1 through N6, but diode D0 remains reverse-biased. Thus, no charge flows from the power supply P0. The cycle continues with closure of switch S8, switch S7 remaining closed for the duration of the charge cycle. Charge flows from stack capacitors C2 and C1, through diode D8, through switches S8 and S7, and finally into load capacitor CL. Charge continues to flow until the voltage at node N2 equals the voltage drop across load capacitor CL plus the voltage drop across diode D8. No charge flows through diode D7, it being reverse-biased during this and subsequent portions of the charge cycle. Again, no charge flows from the power supply P0, as diode D0 remains reverse-biased. Operation continues until it is time to close switch S12. At this time, diode D0 becomes forward-biased and charge flows from power supply P0, through diodes D0 and D12, through closed switches S12, S11, S10, S9, S8 and S7, and finally into load capacitor CL. The final voltage drop across the load capacitor CL equals V0 minus the voltages dropped across diodes D0 and D12. This completes the charge cycle and also completes one full discharge/charge cycle of the load CL.

Since charge only flows from the power supply when switch S12 is closed, approximately 1/6 of the power is required when compared with the power which a single power supply without a capacitor stack would use. Again, since only voltage changes of order 1/6 of V0 occur during any step in the cycle, less electrical noise results. The voltage dropped across any given switch during the cycle is also limited to approximately 1/6 of V0, allowing use of switching devices with reduced voltage specifications.

Figure 7:
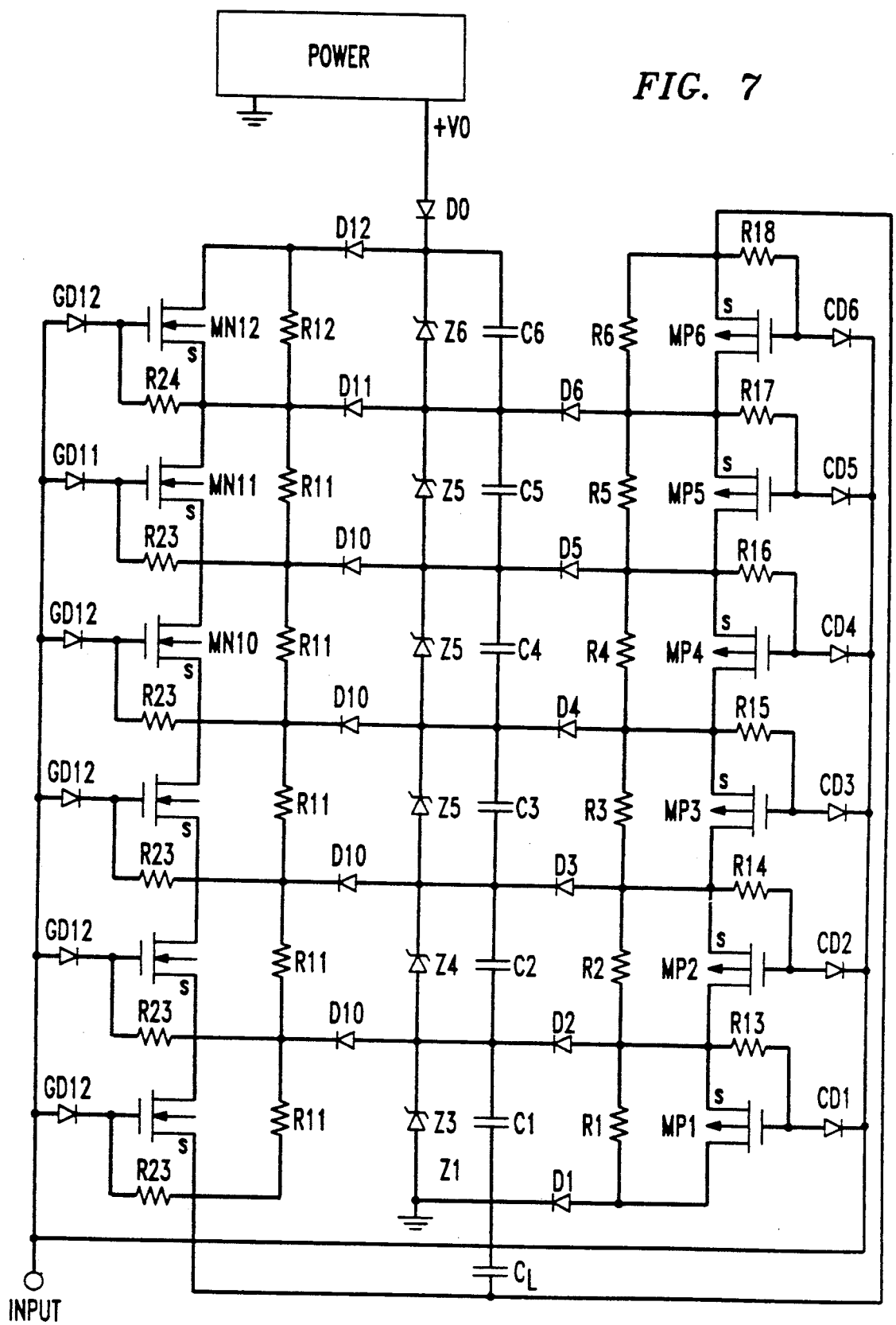
FIG. 7 is a variation of the circuit of FIG. 6 in which switching is effected with MOS devices.

The reduced voltage specification allows easy substitution of MOS semiconductor devices for the switches of FIG. 6. FIG. 7 shows how P-channel MOSFETs MP1 through MP6 may replace the switches S1 through S6 of FIG. 6. Similarly, N-channel devices MN7 through MN12 may replace the switches S7 through S12 of FIG. 6. To prevent the MOSFETs from drifting into conduction erroneously, gate-source resistors R13 through R24 are included.

One potential problem with the use of semiconductor devices instead of switches is the potential of leakage currents flowing through any device, which should be turned off, thus altering the source voltage. In FIG. 7, the sources of MOSFETs are marked by a lower case "s" of subsequent devices. This problem could also lead to premature conduction; or worse, a voltage which can exceed the voltage limitations of the semiconductor devices used. To prevent this, resistors R1 through R6 stabilize the source voltages of P-channel MOSFETs MP1 through MP6 by providing a controlled leakage path.

Similarly, resistors R7 through R12 protect N-channel devices MN7 through MN12 (FIG. 7). Gate protection diodes GD1 through GD6 prevent reverse biasing of the gate-source terminals of P-channel devices MP1 through MP6. Similarly, gate protection diodes GD7 through GD12 protect N-channel devices MN7 through MN12. These gate protection diodes also provide the logic required to turn the appropriate devices on (into conduction). One advantage of this approach is that the voltage across the load capacitor CL is continuously variable and controllable, in contrast to the switch approach of FIGS. 5 and 6. The circuit of FIG. 7 thus is most advantageous for use as a power-conserving driver amplifier useful for driving an actuator for the control of noise and vibration.

Figure 8:
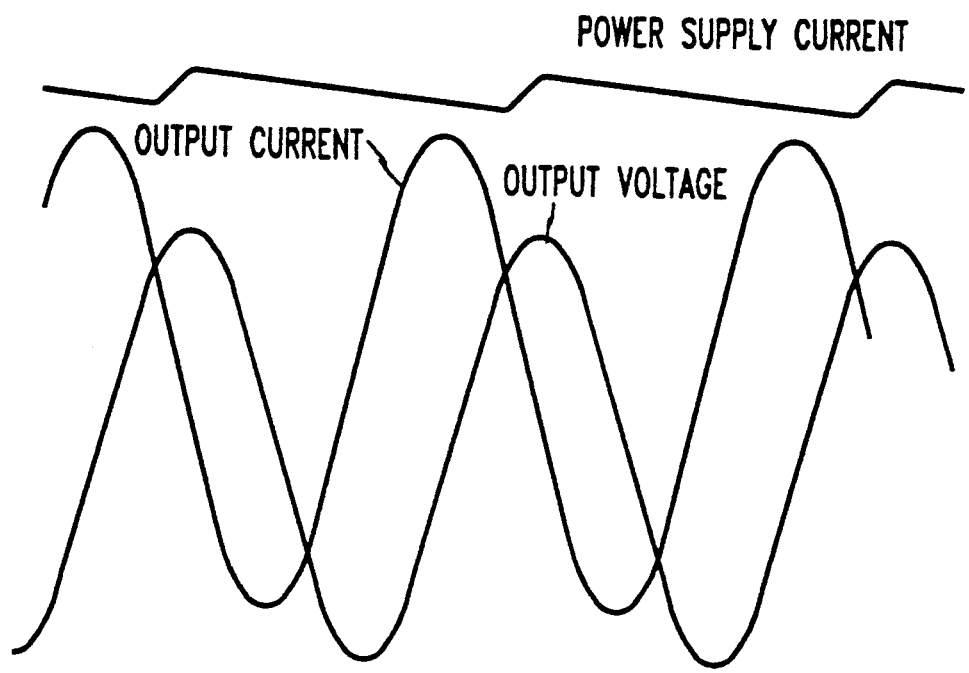
FIG. 8 is a plot of the voltage and current characteristic of the FIG. 7 circuit.

The rest of the circuit of FIG. 7 is similar to that of FIG. 6. Stack capacitors C1 through C6 shuttle charge to and from load capacitor CL. Current steering diodes D1 through D12 behave as before. Similarly, zener diodes Z1 through Z6 protect the stack capacitors from overvoltage. As before, charge flows from the power supply P0 when MOSFETs MN7 through MN 12 are conducting during the final step of the load charge cycle. The benefits of the circuit shown in FIG. 6 are maintained, and in addition the added improvement of a continuously (not stepwise) controllable output voltage across load capacitor CL is provided. The benefits are illustrated in the plot of FIG. 8 which shows the output voltage for a 40 stage (40 stack capacitors), 1000 volt model based on the embodiment of FIG. 7 driving a 100 $\mu$F load capacitor. No discontinuity in the output voltage is observed. The current flowing into the load capacitor is illustrated in FIG. 8 and shows only slight spiking.

Figure 9:
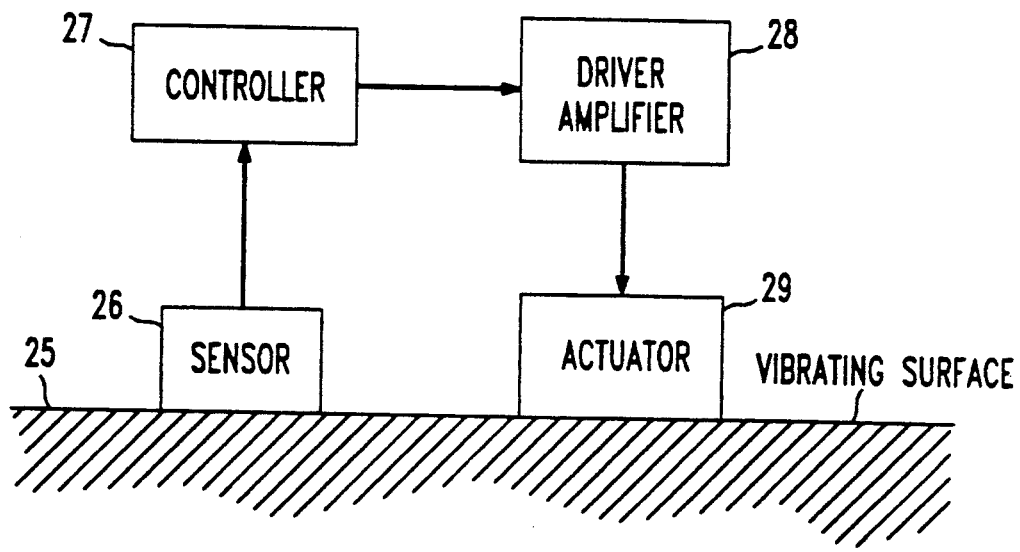
FIG. 9 is a schematic block diagram of the invention applied to the active control of an actuator.

FIG. 9 shows schematically the application of the invention to the field of active control of vibrational energy. A surface 25 which, for example, may be a motor mounting or the like, is monitored for frequency and amplitude of vibrations by sensor 26. A controller 27 receives the data output from sensor 26, and using various algorithms known in the art, applies a specific output signal to driver amplifier 28. Amplifier 28 is one of the embodiments of the instant invention such as, for example, that defined in FIG. 7. Amplifier 28 responsively drives an actuator 29 mounted on surface 25, thus to generate a counterforce to the vibrational energy present in the motor mount. As a result, the vibrational energy is substantially reduced and the incident circuit and RF noise which prior art driver amplifiers generate is substantially eliminated.

In summary, the instant invention addresses the problem of efficient electrical performance of amplifiers driving predominantly capacitive loads over large bandwidths with low resulting phase shifts. This invention is free of the electrical noise problems associated with switching amplifiers designed for the same applications and is adaptable to differing applications through the addition or removal of identical modular circuits. In particular, this invention is suitable for the driving of electrostrictive or piezoelectric structures to accomplish active noise/vibration control in building structures and the like.

I claim:

1. An amplifier for driving a capacitive load, comprising:
   a power source;
   a plurality of capacitors arranged in series-connected stack relation;
   the connecting points between adjacent ones of said stacked capacitors each comprising a node;
   said power source being connected to one end of said stack; and
   switching means comprising plural switches, each said switch being associated with a respective one of said stacked capacitors, for sequentially connecting successively and one at a time, one or more of said stacked capacitors to a first side of said capacitive load, the second side of said capacitive load being maintained at ground potential, and thereafter for connecting in reverse sequence said one or more said stacked capacitors.

2. Apparatus in accordance with claim 1, wherein said switching means further comprises:
   means for opening the switch previously closed before closing the next succeeding switch, thereby to raise the load voltage applied to said capacitive load incrementally until a desired output voltage is applied to said capacitive load; and
   means for effecting a reversal of said stacked capacitor charge sequence by reversing the sequence of switch operations, thereby to sequentially discharge said capacitive load into said capacitor stack and increase the voltages at said nodes to store energy recovered from said capacitive load in said stacked capacitors;
   the thus-recovered energy being re-used during the subsequent load charge cycle.

3. Apparatus in accordance with claim 2, wherein the capacitance values of each of said stacked capacitors are substantially identical.

4. Apparatus in accordance with claim 3, wherein the capacitance values of each of said stacked capacitor are chosen to be large relative to the capacitance value of said capacitive.

5. Apparatus in accordance with claim 4, further comprising means for clamping the voltage across each one of said stacked capacitors to a predetermined maximum value.

6. Apparatus in accordance with claim 5, wherein said clamping means comprises a plurality of series-connected zener diodes each said diode being connected across a one of said stacked capacitors, the zener voltages being selected to be relatively high.

7. An amplifier for driving a capacitive load, comprising:
   a power source;
   a plurality of capacitors arranged in series-connected stacked relation;
   the connecting points between adjacent ones of said stacked capacitors each comprising a node;
   said power source being connected to one end of said stack;
   a first and a second array of current-steering diodes;
   the diodes of said first diode array being respectively connected to a first side of a corresponding stacked capacitor and the diodes of said second diode array being respectively connected to the opposite side of a corresponding said stacked capacitor;
   corresponding diodes of said first and second arrays being paired in series-connection with same-direction conduction;
   a first set of switch means for sequentially connecting diodes of said first array to one side of said capacitive load;
   a second set of switch means for sequentially connecting diodes of said second array to the other side of said capacitive load;

said diode arrays and said switch sets sequentially connecting successive ones of said stacked capacitors to a first side of said capacitive load, said second side being at ground potential, thereby to raise the load voltage applied to said capacitive load incrementally until the desired output voltage is applied to said capacitive load; and said diode arrays and said switch sets effecting a reversal of said stacked capacitor charge sequence, thereby to sequentially discharge said capacitive load into said capacitor stack and thereby increase the voltages at said node to store energy recovered from said capacitive load in said respective stacked capacitors;

the thus-recovered energy being re-used during the subsequent load charge cycle.

8. Apparatus in accordance with claim 7, wherein on completion of said discharge cycle of said capacitive load, the voltage drop across said capacitive load is substantially equal to the voltage drop across the first of said diodes in said first diode array.

9. Apparatus in accordance with claim 8, further comprising means including a blocking diode connected between said power source and one end of said capacitor stack, for selectively preventing charge from flowing back into said power source and for isolating said power source from said capacitive.

10. Apparatus in accordance with claim 9, wherein the capacitive values of each said stacked capacitors are substantially identical.

11. Apparatus in accordance with claim 10, wherein the capacitive values of each said stacked capacitor are chosen to be large relative to the capacitive value of said capacitive load.

12. Apparatus in accordance with claim 11, further comprising: means for clamping the voltage across each one of said stacked capacitors to a predetermined maximum value.

13. Apparatus in accordance with claim 12, wherein said clamping means comprises a plurality of series-connected zener diodes each said diode being connected across a one of said stacked capacitors, the zener voltages being selected to be relatively high.

14. Apparatus in accordance with claim 7, 8, 9, 10, 11, 12, or 13, wherein
said first set of switches comprises P-channel MOSFET devices;
said second set of switches comprises N-channel MOSFET devices; and
said apparatus further comprises means including said MOSFET devices for effecting a continuous increase of voltage across said capacitive load during charging and for effecting a continuous decrease of voltage across said capacitive load during discharge.

15. Apparatus in accordance with claim 1, further comprising:
actuator means driven by said amplifier, and
means for applying said actuator means to a vibrating element to reduce vibrations.

16. Apparatus in accordance with claim 7, further comprising:
actuator means driven by said amplifier; and
means for applying said actuator means to a vibrating element to reduce vibrations.

17. Apparatus in accordance with claim 15 or 16, wherein said actuator means comprises predominately an electrostrictive material.

18. Apparatus in accordance with claim 15 or 16, wherein said actuator means comprises predominately a piexoelectric material.

19. Apparatus in accordance with claim 16, wherein said first set of switches comprises P-channel MOSFET devices; and
wherein said second set of switches comprises N-channel MOSFET devices.

* * * * *